(12) United States Patent
Yoshihara et al.

(10) Patent No.: US 8,029,624 B2
(45) Date of Patent: Oct. 4, 2011

(54) RINSE METHOD AND DEVELOPING APPARATUS

(75) Inventors: Kousuke Yoshihara, Koshi (JP); Junji Nakamura, Koshi (JP); Hirofumi Takeguchi, Koshi (JP); Taro Yamamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 692 days.

(21) Appl. No.: 11/602,390

(22) Filed: Nov. 21, 2006

(65) Prior Publication Data
US 2007/0119479 A1    May 31, 2007

(30) Foreign Application Priority Data
Nov. 29, 2005    (JP) .................................. 2005-343914

(51) Int. Cl.
*B08B 7/04*    (2006.01)
(52) U.S. Cl. .............. 134/18; 134/26; 134/42; 134/137; 134/153
(58) Field of Classification Search .................... 134/18, 134/26, 27, 42, 94.1, 137, 153
See application file for complete search history.

(56) References Cited

U.S. PATENT DOCUMENTS

| | | | | |
|---|---|---|---|---|
| 5,275,667 A | * | 1/1994 | Ganesan et al. | 134/1 |
| 6,062,240 A | * | 5/2000 | Sada et al. | 134/95.2 |
| 2003/0045098 A1 | * | 3/2003 | Verhaverbeke et al. | 438/689 |
| 2003/0045131 A1 | * | 3/2003 | Verbeke et al. | 438/795 |

FOREIGN PATENT DOCUMENTS

| | | | |
|---|---|---|---|
| JP | 10-172951 | * | 6/1998 |
| JP | 2001-53051 | * | 2/2001 |
| JP | 2002-57093 | | 2/2002 |
| JP | 2002-057093 | * | 2/2002 |

* cited by examiner

*Primary Examiner* — Michael Barr
*Assistant Examiner* — Saeed T Chaudhry
(74) *Attorney, Agent, or Firm* — Smith, Gambrell & Russell, LLP

(57) ABSTRACT

A rinse method for rinsing a substrate having an exposure pattern thereon developed includes presetting conditions for a rinse process according to surface states of the substrate, measuring a surface state of the substrate, selecting a corresponding condition for the rinse process based on the measured surface state of the substrate, and performing the rinse process under the selected condition.

10 Claims, 14 Drawing Sheets

MEMORY UNIT

86

120

| GROUP | CONTACT ANGLE (DEGREES) | RECIPE |
|---|---|---|
| 1 | ~10 | a |
| 2 | 10~20 | b |
| 3 | 20~25 | c |
| 4 | 25~30 | d |
| 5 | 30~ | e |

FIG.12

RINSE METHOD AND DEVELOPING APPARATUS

BACKGROUND OF THE INVENTION

1. Field of the Invention

The present invention relates to a rinse method which performs a rinse process on a substrate, such as a semiconductor wafer, after an exposure pattern is developed, a developing apparatus which performs such a rinse process, and a computer readable storage medium.

2. Description of the Related Art

In semiconductor device fabrication process, for example, a resist pattern is formed as a mask for forming a predetermined pattern by a so-called photolithography technology in which after a resist liquid is supplied to the top surface of a semiconductor wafer (hereinafter called "wafer") to form a resist film, and an exposure process is performed on a resist-coated wafer according to a predetermined pattern, an exposure pattern formed on the resist film on the wafer is developed.

In the developing process included in the individual processes of such a photolithography technique, a developing unit (DEV) is supplied to a wafer to form a developer paddle on the entire surface thereof, the developing process is carried out with natural convection for a predetermined time, after which the developer is removed by a rinse process, and then a dry process is performed. The rinse process is important to remove a developer residue like a molten substance. If the process is done insufficiently, multiple development defects occur, thus reducing the product yield.

It is known that such development defects can be reduced normally by adjusting the rinse condition or the like, so that there has been a method of adjusting the rinse condition or the like so as to reduce development defects while observing the condition for the occurrence of the development defects.

Japanese Patent Laid-Open Publication No. 2002-57093 describes that a method of actually measuring development defects with a surface inspection apparatus or the like may not be able to provide highly reliable measurements, and the apparatus is expensive, and discloses, as a technique of avoiding such an inconvenience, a method of immersing the surface of a substrate in a pre-process liquid to dissolve the components in the developer adhered to the surface of the substrate into the pre-process liquid after a post-development rinse process is performed, analyzing the pre-process liquid to quantitatively analyze the components in the developer to thereby grasp development defects, and setting the time or the like of supplying the rinse liquid based on the analysis result.

Even if this method of grasping development defects is employed, however, the condition that reduces development defects differs depending on the material of a resist to which the developer is applied, and the condition needs to be set again every time the material is changed, thereby increasing the number of working steps required to set up the apparatus. The work of setting the condition after grasping development defects should not necessarily find an optimal condition.

BRIEF SUMMARY OF THE INVENTION

It is an object of the invention to provide a rinse method capable of promptly grasping a condition which reduces development defects regardless of a target substrate and performing a rinse process after a developing process.

It is another object of the invention to provide a developing apparatus which performs such a rinse process.

It is a further object of the invention to provide a storage medium storing a control program which executes the rinse method.

According to the first aspect of the invention, there is provided a rinse method for rinsing a substrate having an exposure pattern thereon developed, comprising presetting conditions for a rinse process according to surface states of the substrate; measuring a surface state of the substrate; selecting a corresponding condition for the rinse process based on the measured surface state of the substrate; and performing the rinse process under the selected condition.

According to the first aspect, measuring the surface state can be carried out by measuring a contact angle to a rinse liquid as the surface state of a substrate. Presetting the condition for the rinse process according to the surface state of the substrate can be carried out by setting conditions for the rinse process which can allow development defects to fall within a tolerance for respective surface states.

According to the second aspect of the invention, there is provided a developing apparatus which develops an exposure pattern formed on a resist film on a substrate, comprising a developing unit which performs a developing process and a rinse process on the substrate in order; a surface-state measuring unit which measures a surface state of the substrate to be subject to the developing process; a memory unit storing information having a rinse condition set therein according to the surface state of the substrate; and a control unit which selects a condition corresponding to the surface state of the substrate measured by the surface-state measuring unit from the information stored in the memory unit, and controls the developing unit in such a way that the rinse process is executed under the selected condition.

According to the second aspect, the surface-state measuring unit can measure a contact angle to a rinse liquid on the surface of a substrate. The memory unit has a control table where the conditions for the rinse process which can allow development defects to fall within a tolerance are associated with respective surface states.

According to the third aspect of the invention, there is provided a computer readable storage medium storing a control program for allowing a computer to control a developing apparatus which performs a developing process and a rinse process on the substrate in order, wherein the control program, when being executed, allows the computer to control the developing apparatus in such a way as to perform procedures of allowing a unit which measures a surface state of the substrate to measure the surface state of the substrate, selecting a condition corresponding to the measured surface state of the substrate from information stored in a memory unit and having a rinse condition set therein according to the surface state of the substrate, and executing the rinse process under the selected condition.

According to the third aspect, the surface state can be a contact angle to a rinse liquid on the surface of a substrate. Information stored in the memory unit and having a rinse condition set therein according to the surface state of the substrate can be a control table where the conditions for the rinse process which can allow development defects to fall within a tolerance are associated with respective surface states.

To overcome the problems, the present inventors grasped the behavior of the occurrence of development defects for substrates with various surface states, and discovered that the behavior of the occurrence of development defects significantly depend on the surface state of a substrate after development. According to the invention, therefore, rinse conditions are preset according to surface states of a substrate, the surface state of a substrate is measured, a rinse condition corresponding to the measured surface state of the substrate is selected, and a rinse process is performed under the selected condition. Provided that the optimal rinse conditions which hardly cause development defects are set in association with individual substrate surface states, if just the surface state of a substrate is grasped, the optimal rinse condition corresponding to the surface state can be selected quickly, and a rinse process for the substrate can be performed under the condition. This makes it possible to promptly grasp the optimal condition regardless of a target substrate and perform a rinse process with fewer development defects.

BRIEF DESCRIPTION OF THE SEVERAL VIEWS OF THE DRAWINGS

FIG. 12 is a diagram showing a control table stored in a memory unit;

DETAILED DESCRIPTION OF THE INVENTION

An embodiment of the present invention will be described in detail below with reference to the accompanying drawings.

Figure 1:
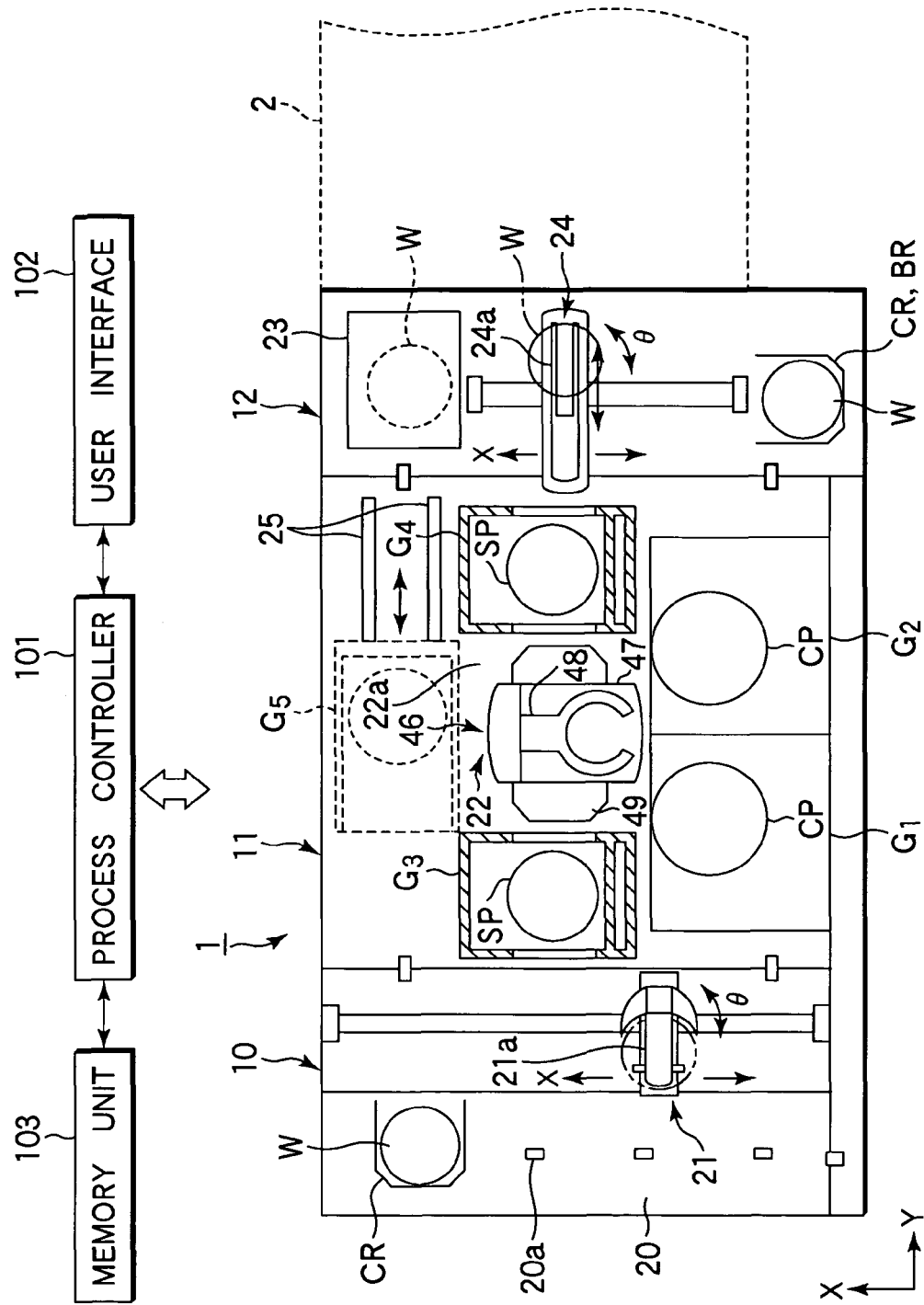
FIG. 1 is a schematic plan view showing a resist coating and developing system provided with a developing apparatus which executes the rinse method of the present invention.
Figure 2:
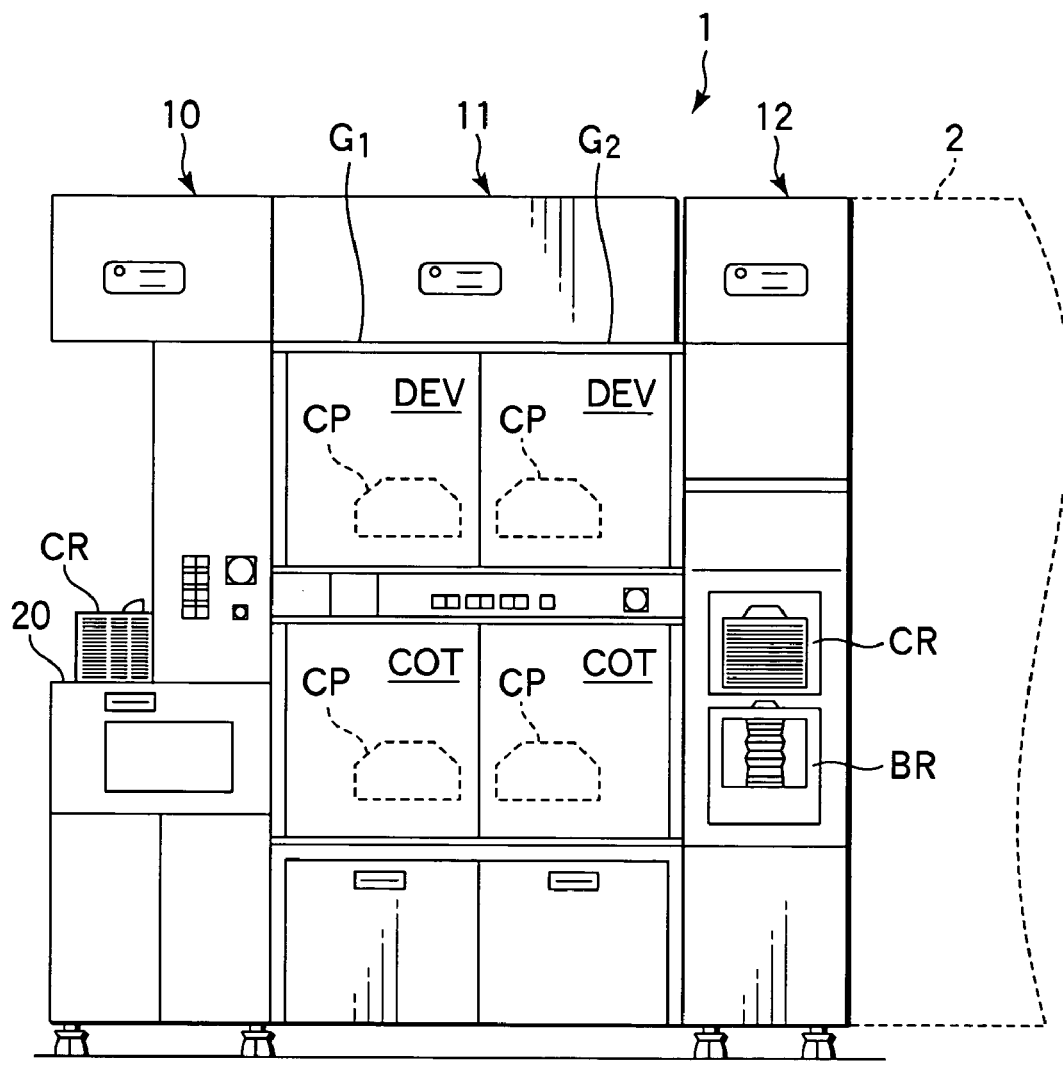
FIG. 2 is a front view showing the resist coating and developing system of FIG. 1.
Figure 3:
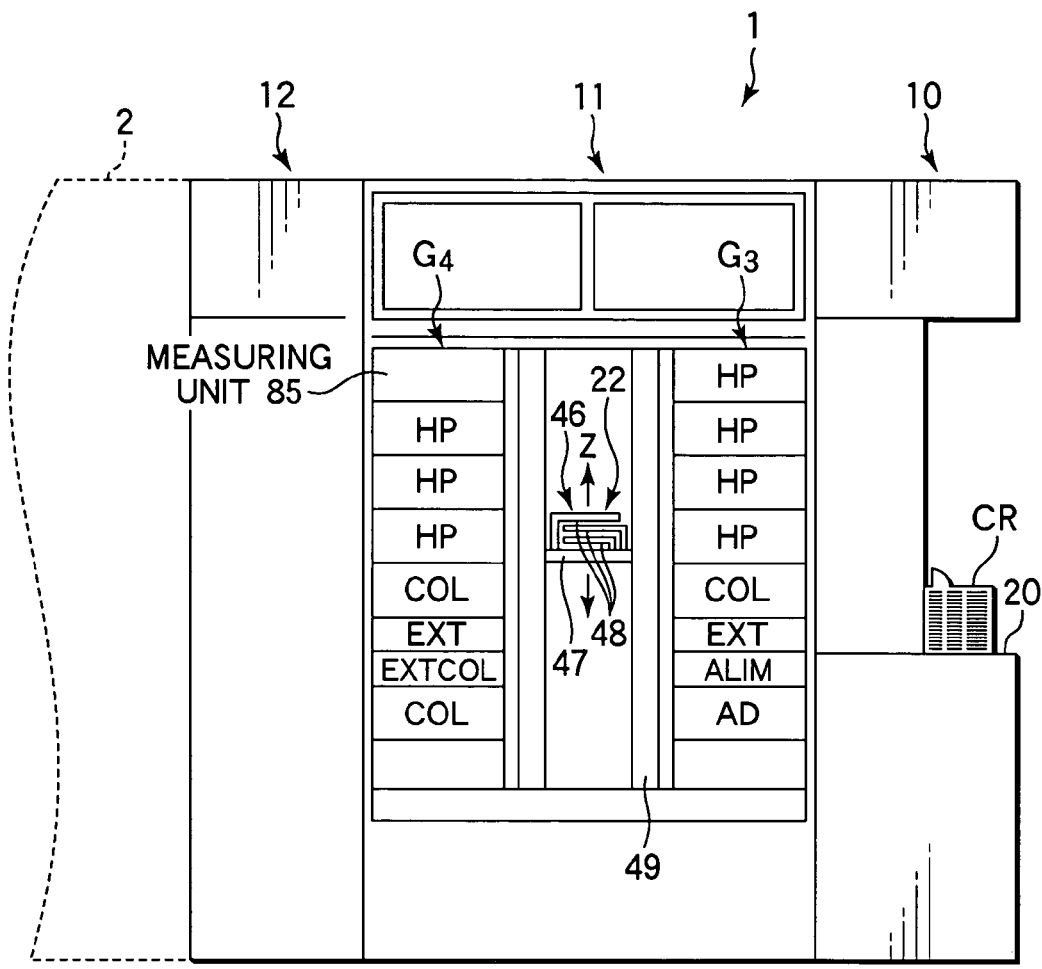
FIG. 3 is a rear view showing the resist coating and developing system of FIG. 1.

FIG. 1 is a schematic plan view showing a resist coating and developing system provided with a developing apparatus which executes the rinse method of the present invention, FIG. 2 is a front view thereof, and FIG. 3 is a rear view thereof.

This resist coating and developing system 1 comprises a cassette station 10 as a transfer station, a process station 11 having a plurality of process units, and an interface section 12 for transferring a wafer W to an exposure apparatus 2 provided adjacent to the process station 11.

The cassette station 10 transfers a wafer cassette CR where a plurality of wafers W as subjects to be processed are placed into and out of this system. In the cassette station 10, as shown in FIG. 1, four positioning projections 20a are formed along an X direction in the diagram on a placing table 20 on which wafer cassettes CR are to be placed, and the wafer cassettes CR can be placed. The cassette station 10 also has a wafer transfer mechanism 21 positioned between the placing table 20 and the process station 11. The wafer transfer mechanism 21 has a wafer transfer arm 21a which is movable in the cassette layout direction (X direction) and the layout direction of the wafers W in the wafer cassette CR (Z direction), and is rotatable in a θ direction. The wafer transfer mechanism 21 can selectively access any wafer cassette CR and can access the process station 11 with the wafer transfer arm 21a.

The process station 11 has the plurality of process units for carrying out a series of processes when coating and development are performed on the wafer W, and the process units are arranged in multiple stages at predetermined positions to process the wafers W one by one. As illustrated in FIG. 1, the process station 11 has a wafer transfer passage 22a at the center portion thereof, in which a main wafer transfer mechanism 22 is provided. All the process units are laid out around the wafer transfer passage 22a. Those process units are separated into a plurality of process unit groups in each of which a plurality of process units are laid out in multiple stages along the normal direction.

As illustrated in FIG. 3, the main wafer transfer mechanism 22 is structured that it has a wafer transfer device 46 elevatable in the up and down direction (Z direction) inside a cylindrical support 49. The cylindrical support 49 is rotatable by the rotational driving force of a motor (not shown), while the wafer transfer device 46 can rotate integrally with the cylindrical support 49. The wafer transfer device 46 has a plurality of holding members 48 movable in the back and forth directions of a transfer base 47, whereby the exchange of the wafer W between the respective process units is enabled by the holding members 48.

As illustrated in FIG. 1, four process unit groups $G_1$, $G_2$, $G_3$ and $G_4$ are laid out around the wafer transfer passage 22a, and a process unit group $G_5$ can be laid out as needed.

The first and second process unit groups $G_1$ and $G_2$ among them are laid out in parallel with each other on the front side of the system (near side in FIG. 1), the third process unit group $G_3$ is provided adjacent to the cassette station 10, while the fourth process unit group $G_4$ is provided adjacent to the interface station 12. A fifth process unit group $G_5$ can be laid out on the rear side.

In the first process unit group $G_1$, two of resist coating units (COT) of a spinner type, which applies a resist to the wafer W placed on a spin chuck (not illustrated) in a coater cup (CP), and two developing units (DEV), which develop a pattern of a resist, are placed one on the other in two stages in order from the bottom. Likewise, in the second process unit group $G_2$, two resist coating units (COT) and two developing units (DEV) are placed one on the other in two stages in order from the bottom. The developing unit (DEV) constitutes the essential portion of a developing apparatus 80 to be described later.

As illustrated in FIG. 3, in the third process unit group $G_3$, multiple oven type process units which carry out a predetermined process on the wafer W placed on a susceptor SP are placed one on another in multiple stages. Specifically, an adhesion unit (AD) which executes a so-called hydrophobic process for enhancing the fixability of a resist, an alignment unit (ALIM) which performs positional alignment two extension units (EXT) which carry the wafer W in and out, a cooling unit (COL) for performing a cooling process, and four hot plate units (HP) which perform heat treatments on the wafer W before an exposure process, after the exposure process, and after a developing process are placed one on another in eight stages in order from the bottom.

In the fourth process unit group $G_4$, likewise, oven type process units are placed one on another in multiple stages. Specifically, a cooling unit (COL), an extension cooling unit (EXTCOL) as a wafer carry-in/carry-out section having a cooling plate, an extension unit (EXT), a cooling unit (COL), three hot plate units (HP) are placed one on another in seven stages in order from the bottom, and a measuring unit 85 which measures the surface state of a wafer W on which a resist is formed is provided on the top of the multi-stage units. The measuring unit 85 constitutes a part of the developing apparatus 80 to be described later.

When the fifth process unit group $G_5$ is provided on the rear side of the main wafer transfer mechanism 22, it is movable sideways as seen from the main wafer transfer mechanism 22 along a guide rail 25. Therefore, even if the fifth process unit group $G_5$ is provided, a maintenance work for the main wafer transfer mechanism 22 can be easily carried out.

In the interface section 12, as illustrated in FIGS. 1 and 2, a portable pickup cassette CR and a fixed buffer cassette BR are laid out in two stages on its front side, a wafer edge exposure device 23 on a rear side thereof, and a wafer transfer mechanism 24 at the center portion thereof. The wafer transfer mechanism 24 has a wafer transfer arm 24a which can move in the X direction and Z direction and is rotatable in the θ direction, so that the wafer transfer mechanism 21 is accessible to both cassettes CR and BR, the wafer edge exposure device 23, the extension unit (EXT) belonging to the fourth process unit group $G_4$, and a wafer transfer table (not shown) on the adjoining exposure apparatus 2.

The individual components of the resist coating and developing system 1, such as individual units and individual transfer mechanisms, are structured in such a manner as to be connected to, and controlled by, a process controller 101 having a CPU. The process controller 101 functions as a high-rank controller, and controls low-rank controllers individually provided in individual transfer mechanisms and individual units. A user interface 102 and a memory unit 103 are connected to the process controller 101. The user interface 102 includes a keyboard for allowing a process manager to perform an input command operation or the like to mange the individual structural parts of the resist coating and developing system 1, and a display for visualizing the operation statuses of the individual components of the resist coating and developing system 1. The memory unit 103 stores a recipe recording a control program for realizing various processes to be executed by the resist coating and developing system 1 under the control of the process controller 101, process condition data, and the like.

An instruction or the like is received from the user interface 102 as needed, an arbitrary recipe is called up from the memory unit 103, and the process controller 101 runs the recipe, thereby causing the resist coating and developing system 1 to execute desired various processes under the control of the process controller 101. The recipe may be stored in a readable storage medium, such as a CD-ROM, a hard disk, a flexible disk, or a non-volatile memory, and may be transmitted from an appropriate device through, for example, an exclusive transmission circuit to be used on line. Note that each component is provided with a low-rank controller which controls the operation of each component based on an instruction from the process controller 101.

In the thus constructed resist coating and developing system 1, first, the wafer transfer pick 21a of the wafer transfer mechanism 21 accesses the wafer cassette CR, takes one of the wafers W out therefrom, and then transfers the wafer W to the extension unit (EXT) of the third process unit $G_3$.

The wafer W is carried into the process station 11 from the extension unit (EXT) by the wafer transfer device 46 of the main wafer transfer mechanism 22, after being aligned by the alignment unit (ALIM) of the third process unit $G_3$, and is transferred to the adhesion unit (AD) where a hydrophobic process (HMDS process) is performed to enhance the fixability of a resist. As the HMDS process involves heating, the wafer W after the HMDS process is transferred by the wafer transfer device 46 to the cooling unit (COL) to be cooled down there.

The wafer W cooled down to a predetermined temperature is then transferred by the wafer transfer device 46 to the resist coating unit (COT) where a coated film is formed. After this coating process, the wafer W is transferred to the hot plate unit (HP) of either the third process unit $G_3$ or the fourth process unit $G_4$, is pre-baked therein, and is then transferred to one of the cooling units (COL) to be cooled down to a predetermined temperature.

The wafer W having the resist film formed thereon is transferred to the alignment unit (ALIM) of the third process unit $G_3$ to be aligned therein, and is then transferred to the interface station 12 via the extension unit (EXT) of the fourth process unit $G_4$.

In the interface station 12, the periphery of the wafer is exposed, for example, by 1 mm, by the wafer edge exposure device 23 to remove an excessive resist. Then, an exposure process is performed on the resist film on the wafer W according to a predetermined pattern by the exposure apparatus 2 provided adjacent to the interface station 12.

The wafer W after exposure is returned to the interface station 12, and is then transferred to the extension unit (EXT) included in the fourth process unit $G_4$ by the wafer transfer mechanism 24. Next, the wafer W is transferred to the hot plate unit (HP) of the third or fourth process unit $G_3$ or $G_4$ by the wafer transfer device 46, and post-exposure baking is performed thereon. The wafer is then cooled down to a predetermined temperature.

Thereafter, the wafer W is transferred to the developing unit (DEV) where the developing process of the embodiment is carried out as will be described later. After the development, the wafer W is transferred to one of the hot plate units (HP) where post baking is performed. The wafer W is then cooled down to a predetermined temperature by the cooling unit (COL). After such a series of processes is completed, the wafer W is returned to the cassette station 10 via the extension unit (EXT) of the third process unit $G_3$ to be accommodated in one of the wafer cassettes CR.

Figure 4:
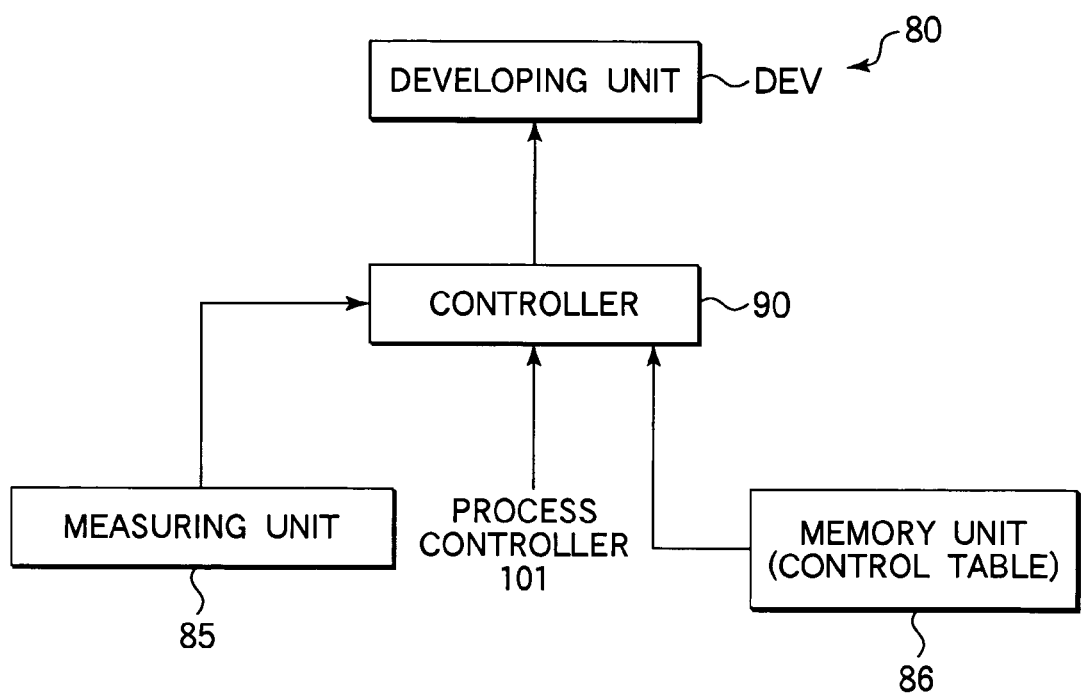
FIG. 4 is a block diagram showing the general structure of a developing apparatus which executes a rinse method according to one embodiment of the invention.

Next, the developing apparatus 80 to which the rinse method according to one embodiment of the invention is adapted will be explained in detail. FIG. 4 is a block diagram showing the general structure of the developing apparatus 80.

As shown in FIG. 4, the developing apparatus 80 has a developing unit (DEV), a controller 90, a measuring unit 85, and a memory unit 86. The developing unit (DEV) is the essential portion of the developing apparatus 80. The controller 90 controls the developing unit (DEV) under the control of the process controller 101. The measuring unit 85 measures the surface state of a wafer W. The memory unit 86 stores a control table where the surface states of a wafer are categorized into a plurality of groups with each of which optimal conditions for the rinse process and the dry process are associated. The surface state of the wafer W measured by the measuring unit 85, e.g., a contact angle to a rinse liquid, is output to the controller 90. The controller 90 selects conditions for the rinse process and the dry process for the surface state from the control table stored in the memory unit 86, and controls the rinse process for the developing unit (DEV) under the selected conditions.

Figure 5:
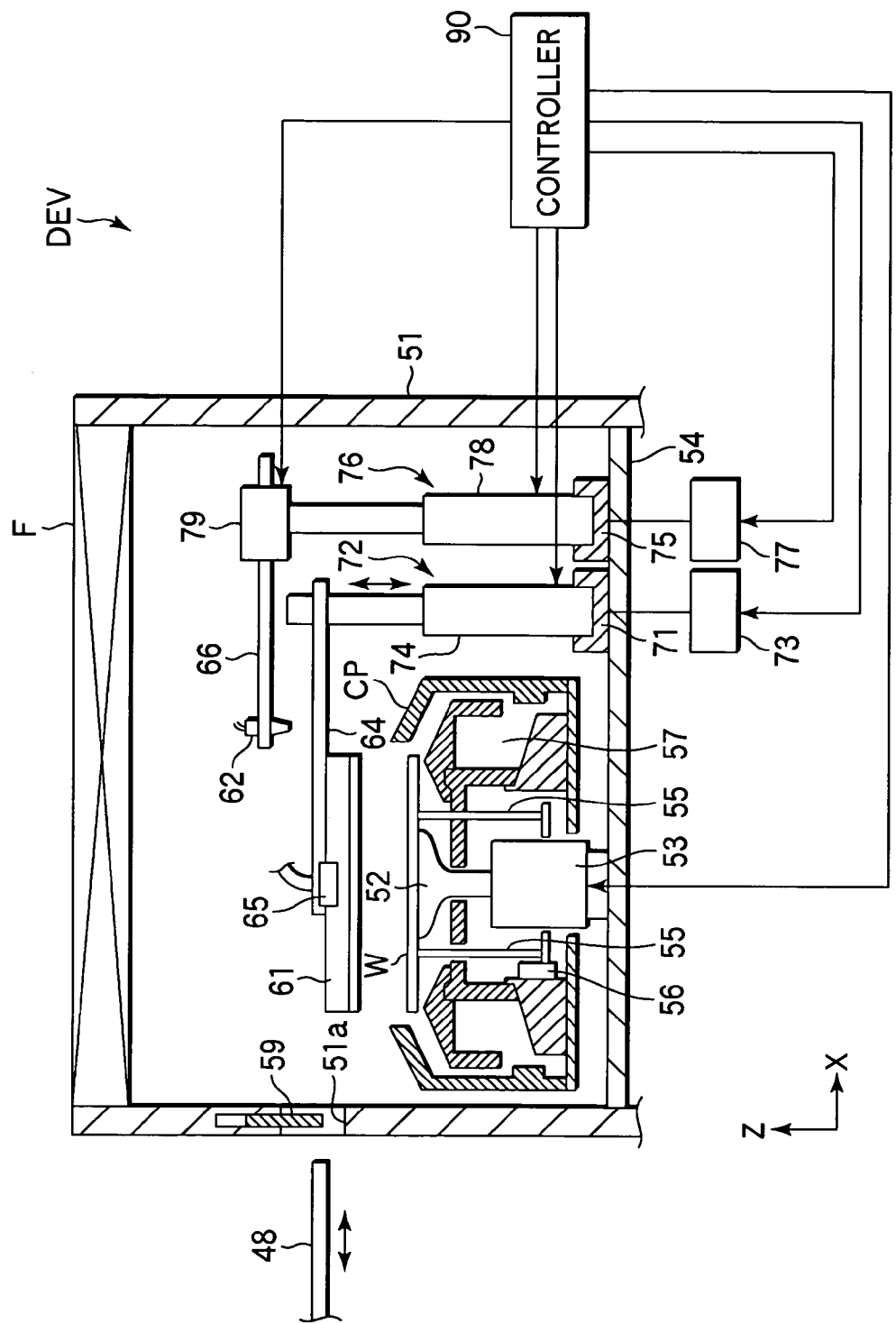
FIG. 5 is a cross-sectional view showing a developing unit which is the essential portion of the developing apparatus of FIG. 4.
Figure 6:
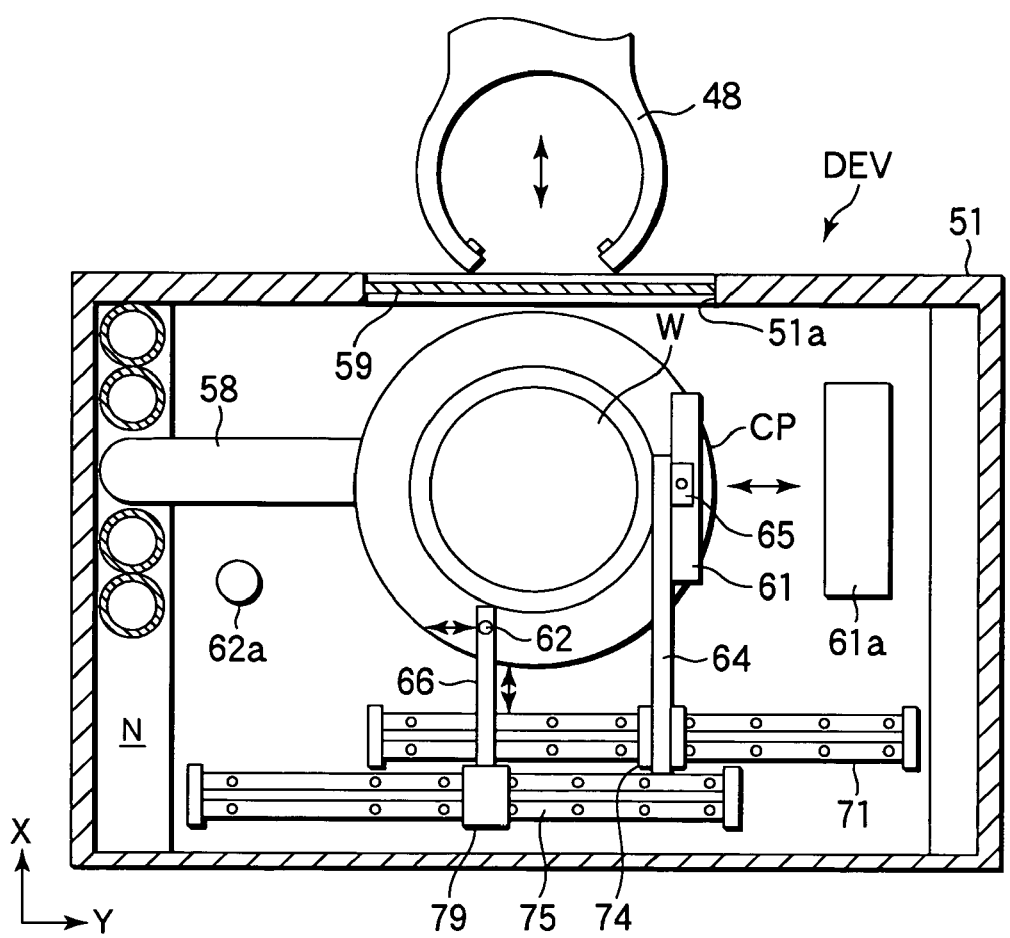
FIG. 6 is a plan view showing the developing unit which is the essential portion of the developing apparatus of FIG. 4.
Figure 7:
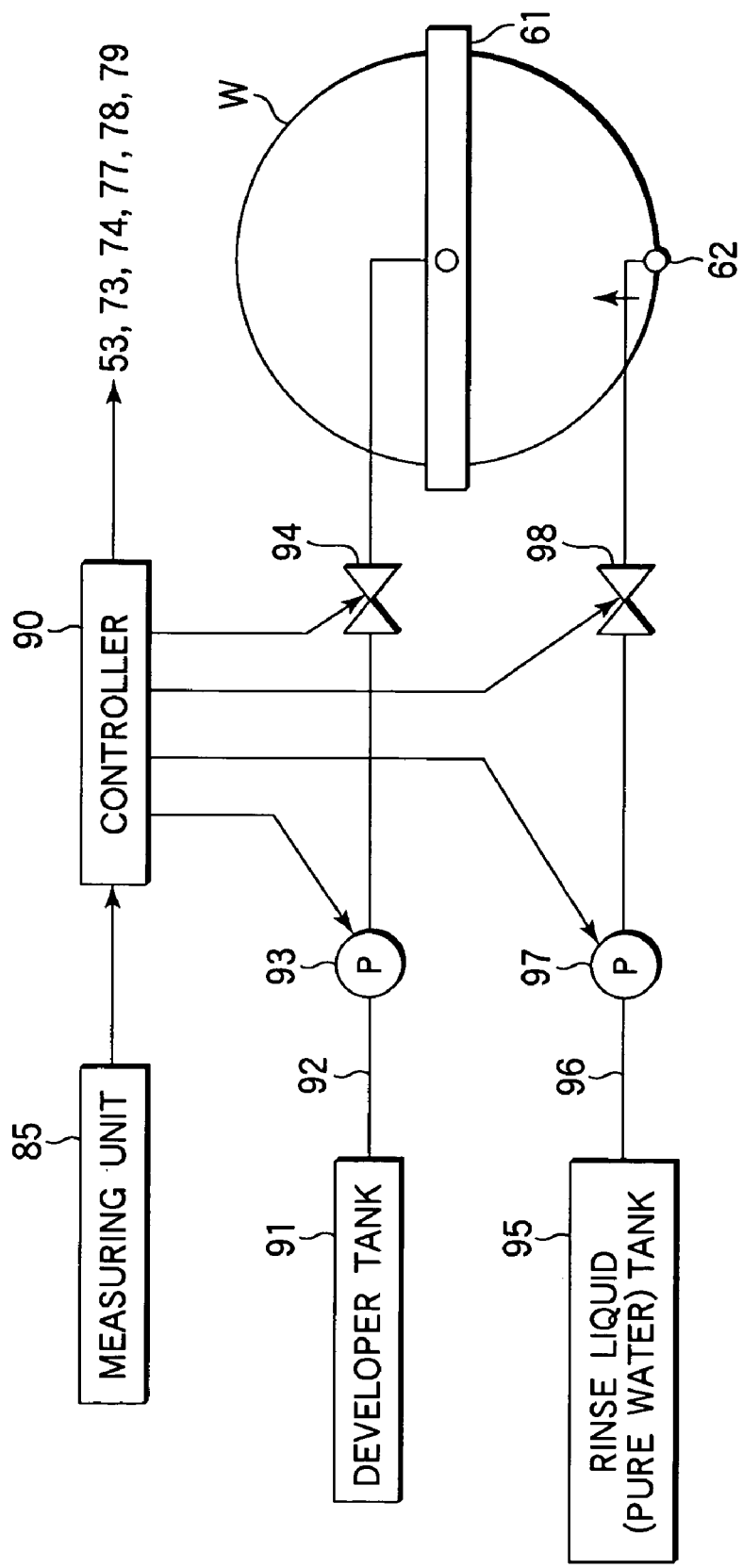
FIG. 7 is a schematic diagram showing a liquid supply system of the developing unit.

Next, the developing unit (DEV) which is the essential portion of the developing apparatus 80 will be described. FIG. 5 is a cross-sectional view showing the developing unit (DEV), FIG. 6 is a plan view thereof, and FIG. 7 is a schematic diagram showing a liquid feeding system of the developing unit (DEV). Note that in FIGS. 5 and 6 like FIGS. 1 to 3, two orthogonal directions on a horizontal plane are the X direction and the Y direction, and the perpendicular direction is the Z direction.

The developing unit (DEV) has a casing 51 whose top is provided with a fan filter unit F for forming the downflow of clean air in the casing 51. Provided in the casing 51 at the center portion thereof is an annular cup CP in which a spin chuck 52 is located. The spin chuck 52 securely vacuum-chucks a wafer W. A drive motor 53 is located under the spin chuck 52 which is rotated by the drive motor 53. The drive motor 53 is attached to a bottom plate 54.

A lift pin 55 which is used at the time of transferring the wafer W is so provided as to be liftable up and down by a drive mechanism 56, such as an air cylinder. A drain port 57 for liquid discharge is provided in the cup CP. A liquid discharge pipe 58 is connected to the drain port 57 (see FIG. 6). As shown in FIG. 6, the liquid discharge pipe 58 passes through space N between the bottom plate 54 and the casing 51 to connect to a liquid discharge port (not shown).

An opening 51a through which the holding member 48 of the wafer transfer device 46 in the main transfer mechanism 22 enters is formed in one side wall of the casing 51. The opening 51a is openable and closable by a shutter 59. In carrying a wafer W in and out, the shutter 59 is opened to let the holding member 48 enter the casing 51. The transfer of the wafer W between the holding member 48 and the spin chuck 52 takes place with the lift pin 55 lifted up.

A developer supply nozzle 61 and a rinse-liquid feed nozzle 62 are provided above the cup CP in such a manner as to be movable between a supply position above the wafer W and a standby position outside the wafer W. The developer supply nozzle 61 supplies a developer to the surface of the wafer W. The rinse-liquid supply nozzle 62 supplies a rinse liquid comprised of, for example, pure water, to the wafer W after development.

The developer supply nozzle 61, which has an elongated shape, is arranged horizontally in the lengthwise direction. The developer supply nozzle 61 has a plurality of discharge ports in the bottom thereof so that the discharged developer as a whole becomes like a band. The developer supply nozzle 61 is removably attached to the tip portion of a first nozzle scan arm 64 by a holding member 65. The first nozzle scan arm 64 is mounted to the upper end portion of a first vertical support member 72 extending upward vertically from a first guide rail 71 laid out on the bottom plate 54 in the Y direction. The developer supply nozzle 61 moves together with the first vertical support member 72 horizontally in the Y direction by a Y-axis drive mechanism 73. The first vertical support member 72 is liftable up and down by a Z-axis drive mechanism 74. The developer supply nozzle 61 moves between a dischargeable position close to the wafer W and a non-discharge position above the dischargeable position according to the up/down motion of the first vertical support member 72. At the time of applying the developer, the developer supply nozzle 61 is positioned above the wafer W, and the developer supply nozzle 61 is applied to the entire surface of the wafer W to form a developer paddle as the wafer W is rotated by at least a half turn, e.g., one turn, while the developer is discharged in a band-like pattern from the developer supply nozzle 61. At the time of discharging the developer, the developer supply nozzle 61 may be moved along the first guide rail 71 without rotating the wafer W.

Figure 8:
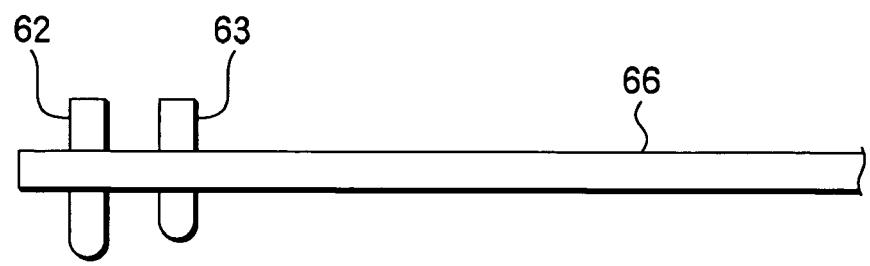
FIG. 8 is a diagram showing an inactive-gas supply nozzle 63 mounted, adjacent to a rinse-liquid supply nozzle 62, to a nozzle scan arm 66.

After completion of the developing process, the rinse-liquid supply nozzle 62, constructed as a straight nozzle, moves above the wafer W and supplies the rinse liquid comprised of, for example, pure water, to a resist film on the wafer W on which a developing pattern is formed. The rinse-liquid supply nozzle 62 is removably attached to the tip portion of a second nozzle scan arm 66. A second guide rail 75 is laid outside the first guide rail 71 on the bottom plate 54. The second nozzle scan arm 66 is mounted to the upper end portion of a second vertical support member 76 extending upward vertically from the second guide rail 75 via an X-axis drive mechanism 79. The rinse-liquid supply nozzle 62 moves together with the second vertical support member 76 horizontally in the Y direction by a Y-axis drive mechanism 77. The second vertical support member 76 is liftable up and down by a Z-axis drive mechanism 78. The rinse-liquid supply nozzle 62 moves between the dischargeable position close to the wafer W and the non-discharge position above the dischargeable position according to the up/down motion of the second vertical support member 76. The second nozzle scan arm 66 is provided movable in the X direction by the X-axis drive mechanism 79. The shape of the rinse-liquid supply nozzle 62 is not particularly limited, and, like the developer supply nozzle 61, may have an elongated shape and have multiple discharge ports, or may be a slit nozzle having a slit-like discharge port. As shown in FIG. 8, the second nozzle scan arm 66 may be provided with an inactive-gas supply nozzle 63 which discharges an inactive gas, such as N*2 gas, together with the rinse-liquid supply nozzle 62, so that the inactive gas is supplied to the center of the wafer W from the inactive-gas supply nozzle 63 to make drying of the rinse liquid at the center portion of the wafer W faster.

The Y-axis drive mechanisms 73, 77, the Z-axis drive mechanisms 74, 78, the X-axis drive mechanism 79, and the drive motor 53 are controlled by the controller 90.

As shown in FIG. 6, a developer-supply-nozzle standby section 61a where the developer supply nozzle 61 stands by is provided on the right side of the cup CP, and a cleaning mechanism (not shown) which cleans the developer supply nozzle 61 is provided at the developer-supply-nozzle standby section 61a. A rinse-liquid-supply-nozzle standby section 62a where the rinse-liquid supply nozzle 62 stands by is provided on the left side of the cup CP, and a cleaning mechanism (not shown) which cleans the rinse-liquid supply nozzle 62 is provided at the rinse-liquid-supply-nozzle standby section 62a.

As shown in FIG. 7, a developer supply pipe 92 to supply the developer from a developer tank 91 retaining the developer is connected to the developer supply nozzle 61. A pump 93 for supplying the developer and an ON/OFF valve 94 are intervened in the developer supply pipe 92. A rinse-liquid supply pipe 96 to supply pure water from a pure water tank 95 retaining pure water as the rinse liquid is connected to the rinse-liquid supply nozzle 62. A pump 97 for supplying the pure water and an ON/OFF valve 98 are intervened in the rinse-liquid supply pipe 96.

The pumps 93 and 97, and the ON/OFF valves 94 and 98, like the Y-axis drive mechanisms 73, 77, the Z-axis drive mechanisms 74, 78, the X-axis drive mechanism 79, and the drive motor 53, are electrically connected to, and controlled by, the controller 90.

Figure 9:
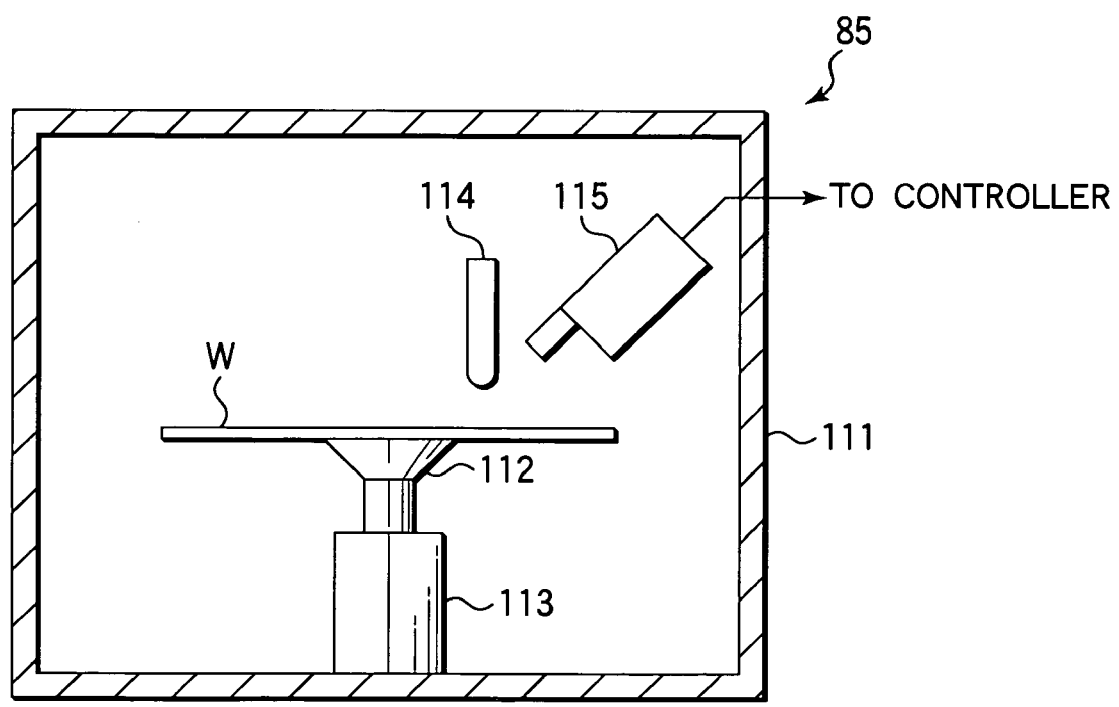
FIG. 9 is a cross-sectional view showing the schematic structure of a measuring unit mounted in the resist coating and developing system of FIG. 1.

The structure of the measuring unit 85 will be described next. FIG. 9 is a cross-sectional view showing the schematic structure of the measuring unit 85. The measuring unit 85 has a casing 111, a spin chuck 112 which holds a wafer W in the casing 111, a motor 113 which rotates the spin chuck 112, a nozzle 114 which drops the rinse liquid (typically pure water), and a detector 115, such as a CCD camera, which detects the status of the rinse liquid dropped on the wafer W.

Figures 10A, 10B, 10C:
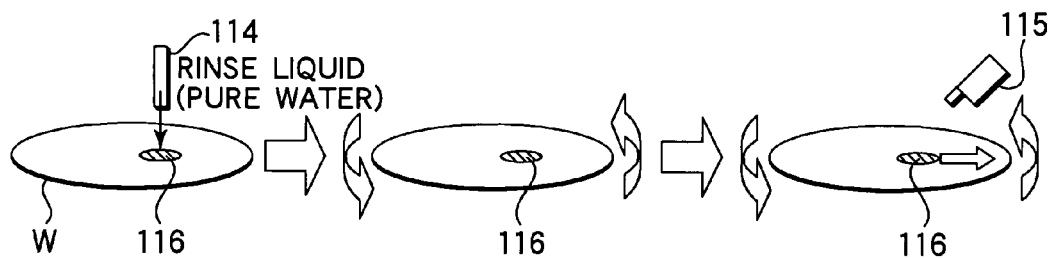
FIGS. 10A to 10C are diagrams illustrating one example of procedures of measuring a dynamic contact angle at a wafer surface using the measuring unit of FIG. 9.
Figures 11A, 11B, 11C:
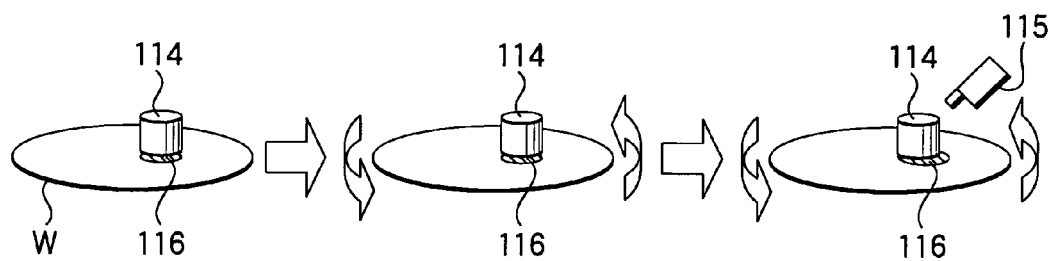
FIGS. 11A to 11C are diagrams illustrating another example of procedures of measuring a dynamic contact angle at a wafer surface using the measuring unit of FIG. 9.

To measure the contact angle using the measuring unit 85, as shown in FIGS. 10A to 10C, for example, first, a fixed amount of the rinse liquid (pure water) is dropped on the wafer W at a predetermined position to form a coated portion (droplets) 116 (FIG. 10A), then the wafer W is rotated (FIG. 10B), and the moving state of the coated portion (droplets) 116 is detected by the detector 115 (FIG. 10C). The dynamic contact angle of the rinse liquid (pure water) can be calculated using the amount of the coated portion (droplets) 116 moved, the time needed for the movement thereof, and the number of rotations of the wafer W. As shown in FIGS. 11A to 11C, the dynamic contact angle can be estimated by restricting the dropped rinse liquid (pure water). That is, first, a fixed amount of the rinse liquid (pure water) is dropped on the wafer W at a predetermined position from the nozzle 114 that also serves as a restricting section, thereby forming the coated portion (droplets) 116, which is restricted (held) with the lower end of the nozzle 114 (FIG. 11A). Then, with the restricted state maintained, the wafer W is rotated (FIG. 11B), and the detector 115 measures the amount of the rinse liquid moved from the restricting section (FIG. 11C). The dynamic contact angle can be calculated from the measurement of the amount of the rinse liquid.

The control table stored in the memory unit 86 will be described next.

In performing a rinse process after development, generally, the wafer W is rotated while the rinse liquid (pure water) is being supplied to the wafer W having the developer held thereon, replacing the developer with the rinse liquid, after which the rinse liquid is spun off. It was found that in this case, how the rinse liquid would spread on the surface of the wafer W significantly depend on the surface state (e.g., the contact angle) of the wafer W after development. How post-development defects occur is greatly affected by how the rinse liquid spreads in the rinse process (at the time of rinsing and drying). Therefore, given that the state (spreading) of the rinse liquid in the rinse process for each of various surface states is grasped and recipes which can ensure optimal spreading of the rinse liquid that minimizes development defects in respective states are prepared, as the surface state of a wafer is detected, the optimal recipe corresponding to the surface state can be selected. As shown in FIG. 12, therefore, the surface states of a wafer are categorized into a plurality of groups according to the classification of the spreading of the rinse liquid, and a control table 120 where the optimal condition (recipe) for the rinse process is associated with the optimal condition for the dry process for each group is stored in the memory unit 86. This ensures an adequate process according to the surface state of a wafer.

The control table 120 will be specifically described below.

Figure 13:
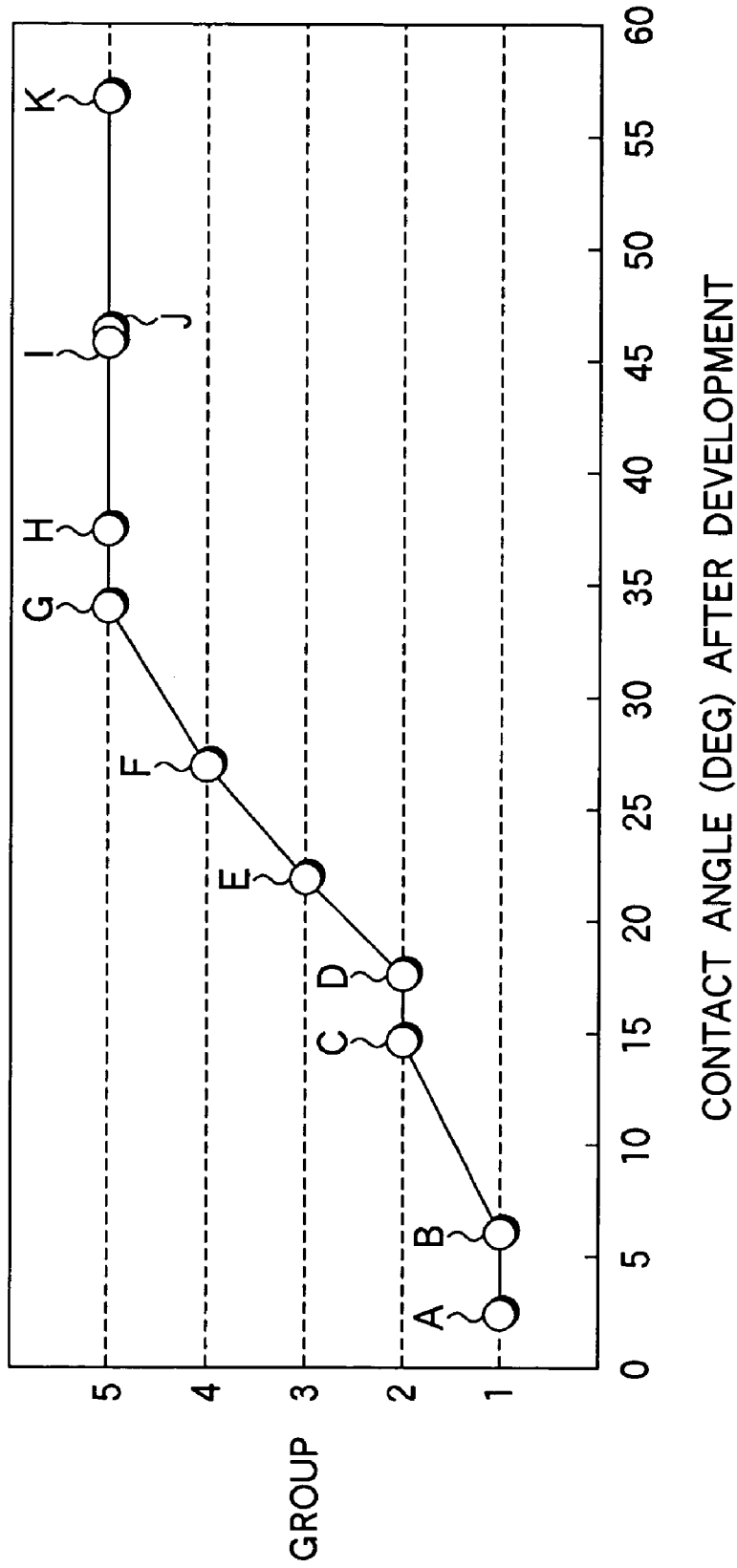
FIG. 13 is a diagram specifically showing the relationship between a contact angle to pure water on a wafer surface and how a rinse liquid spreads at the time of rinsing and drying in a rinse process.

FIG. 13 specifically shows the relationship between the contact angle to pure water on the wafer surface (the surface of a film if formed on the wafer surface) and how the rinse liquid is spread at the time of rising and drying in the rinse process. The contact angles to the pure water when no film is formed and when various films are formed are taken on the horizontal axis, and the states of the rinse liquid (e.g., the states where drying takes place from the center, or the states where drying takes place from the outer circumferential portion) are studied and are categorized into five groups which are taken on the vertical axis.

FIG. 13 shows that in cases A and B where the contact angle is equal to or less than 10 degrees (e.g., a bare silicon wafer in a predetermined type of BARC), the state of the rinse liquid is categorized into a group 1, in cases C and D where the contact angle lies between 10 degrees and 20 degrees (e.g., a KrF resist or EUV resist), the state of the rinse liquid is categorized into a group 2, in case E where the contact angle lies between 20 degrees and 25 degrees (e.g., a KrF resist of a specific kind), the state of the rinse liquid is categorized into a group 3, in case F where the contact angle lies between 25 degrees and 30 degrees (e.g., an ArF resist of a specific kind), the state of the rinse liquid is categorized into a group 4, and in cases G, H, I, J and K where the contact angle is equal to or greater than 30 degrees (e.g., an ArF resist of a specific kind, BARC), the state of the rinse liquid is categorized into a group 5. That is, it is apparent from FIG. 13 that the state of the rinse liquid at the time of performing the rinse and dry process and the surface state of the wafer after development have a clear relationship.

Because the occurrence of post-development defects is greatly affected by the state of the rinse liquid (e.g., the way the rinse liquid spreads) as mentioned above, development defects can be minimized by optimizing the state (spreading) at the time of the rinse process. If a recipe which ensures the optimal state of the rinse liquid is prepared for a wafer for various contact angles (surface states), therefore, as the contact angle of a wafer to be processed is measured, the optimal recipe corresponding to the measurement can be selected, and a rinse process (rinsing and drying) after development can be executed. This can reduce development defects and improve the yield.

Accordingly, the control table 120 shown in FIG. 12, the contact angles to the rinse liquid (pure water) are categorized into the groups 1 to 5 to which optimal recipes a to e are assigned respectively, and the rinse process is executed with the recipe assigned to the measured contact angle.

The following are example of actual recipes.

Figures 14A, 14B, 14C:
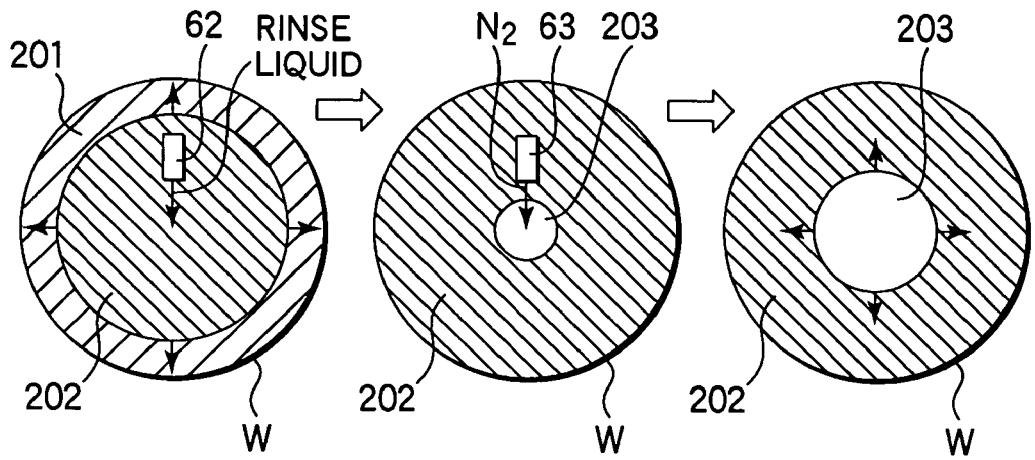
FIGS. 14A to 14C are diagrams for explaining an optimal rinse condition when the contact angle at the wafer surface is equal to or less than 10 degrees.

The group 1 in FIG. 12 represents a case where the contact angle to the rinse liquid (pure water) after development is equal to or less than 10 degrees. According to the optimal recipe a corresponding to this case, as shown in FIGS. 14A to 14C, for example, first, the rinse liquid (pure water) is supplied onto a developer paddle 201 from the rinse-liquid supply nozzle 62 located directly above the center of the wafer W while rotating the wafer W after development, thereby forming a film 202 of the rinse liquid (pure water) on the entire wafer region (FIG. 14A). Subsequently, an inactive gas, such as N*2 gas, is supplied to the center of the wafer W from the inactive-gas supply nozzle 63 for a short period of time, as needed, while rotating the wafer W, thereby forming the core of a dry region 203 at the center of the wafer W (FIG. 14B). Drying progresses, while the wafer W is rotated to widen the dry region 203 from the center side of the wafer W toward the peripheral portion thereof (FIG. 14C). At this time, a scan rinse may be performed to supply the rinse liquid while moving the rinse-liquid supply nozzle 62 from the center side of the wafer W toward the peripheral portion thereof.

Figures 15A, 15B, 15C:
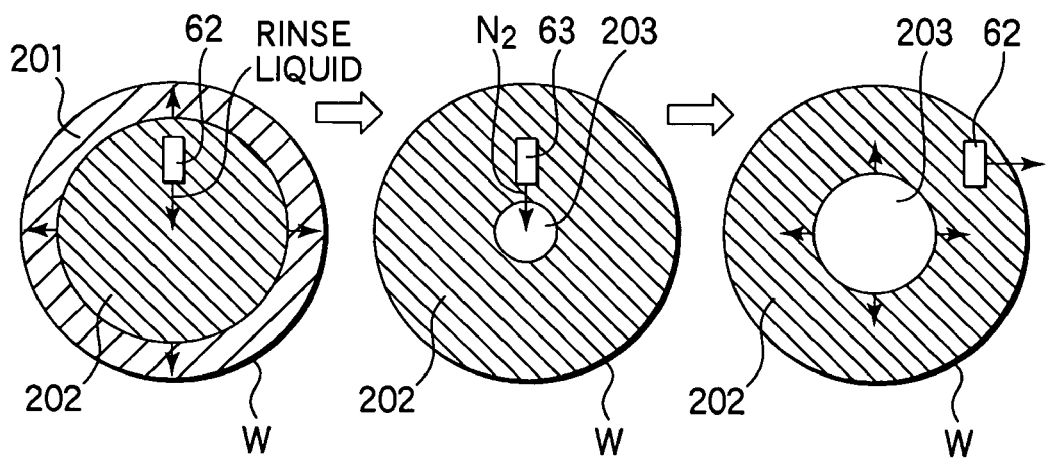
FIGS. 15A to 15C are diagrams for explaining an optimal rinse condition when the contact angle at the wafer surface lies between 10 degrees and 20 degrees.

The group 2 in FIG. 12 represents a case where the contact angle to the rinse liquid (pure water) after development lies between 10 degrees and 20 degrees. According to the optimal recipe b corresponding to this case, as shown in FIGS. 15A to 15C, for example, first, the rinse liquid (pure water) is supplied onto the developer paddle 201 from the rinse-liquid supply nozzle 62 located directly above the center of the wafer W while rotating the wafer W after development, thereby forming the film 202 of the rinse liquid (pure water) on the entire wafer region (FIG. 15A). Subsequently, an inactive gas, such as $N*2$ gas, is supplied to the center of the wafer W from the inactive-gas supply nozzle 63 for a short period of time, as needed, while rotating the wafer W, thereby forming the core of the dry region 203 at the center of the wafer W (FIG. 15B). Drying progresses as a scan rinse is performed to supply the rinse liquid while moving the rinse-liquid supply nozzle 62 from the center side of the wafer W toward the peripheral portion thereof with the wafer W being rotated to widen the dry region 203 from the center side of the wafer W toward the peripheral portion thereof (FIG. 15C). Such a scan rinse prevents the liquid film from being cut during the dry process which would otherwise leave development defects at the cut portion.

Figures 16A, 16B, 16C:
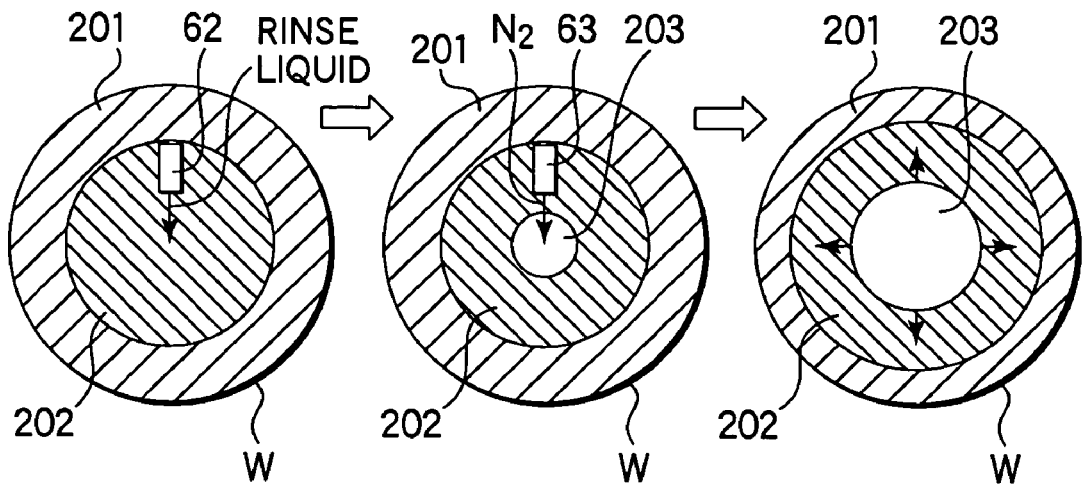
FIGS. 16A to 16C are diagrams for explaining an optimal rinse condition when the contact angle at the wafer surface lies between 20 degrees and 25 degrees.

The group 3 in FIG. 12 represents a case where the contact angle to the rinse liquid (pure water) after development lies between 20 degrees and 25 degrees. According to the optimal recipe c corresponding to this case, as shown in FIGS. 16A to 16C, for example, first, the rinse liquid (pure water) is supplied onto the developer paddle 201 from the rinse-liquid supply nozzle 62 located directly above the center of the wafer W with the wafer W being stopped or while rotating the wafer W at a low speed after development, and the supply of the rinse liquid is stopped before the boundary between the rinse liquid and the developer which is formed at that time reaches the periphery of the wafer W, thereby forming the film 202 of the rinse liquid at the center portion of the wafer W (e.g., a radius of 50 mm or so from the center) (FIG. 16A). Subsequently, an $N*2$ gas is supplied to the center of the wafer W from the inactive-gas supply nozzle 63 for a short period of time while rotating the wafer W, thereby forming the core of the dry region 203 at the center of the wafer W (FIG. 16B). Drying progresses as the dry region 203 is widened by rotating the wafer W and pushing out the developer paddle 201 with the rinse liquid (FIG. 16C). Because the developer is not completely replaced with the rinse liquid, and drying progresses by pushing out the developer paddle 201 with the rinse liquid, the rinse liquid is prevented from being cut during the dry process, which would otherwise leave development defects at the cut portion, even if the contact angle on the surface of the wafer W is relatively high. The supply of the inactive gas may take place at the same time as the supply of the rinse liquid immediately before the supply of the rinse liquid is stopped.

The group 4 in FIG. 12 represents a case where the contact angle to the rinse liquid (pure water) after development lies between 25 degrees and 30 degrees. The optimal recipe d corresponding to this case is basically the same as the recipe c shown in FIGS. 16A to 16C, but different in details therefrom.

Figures 17A, 17B, 17C:
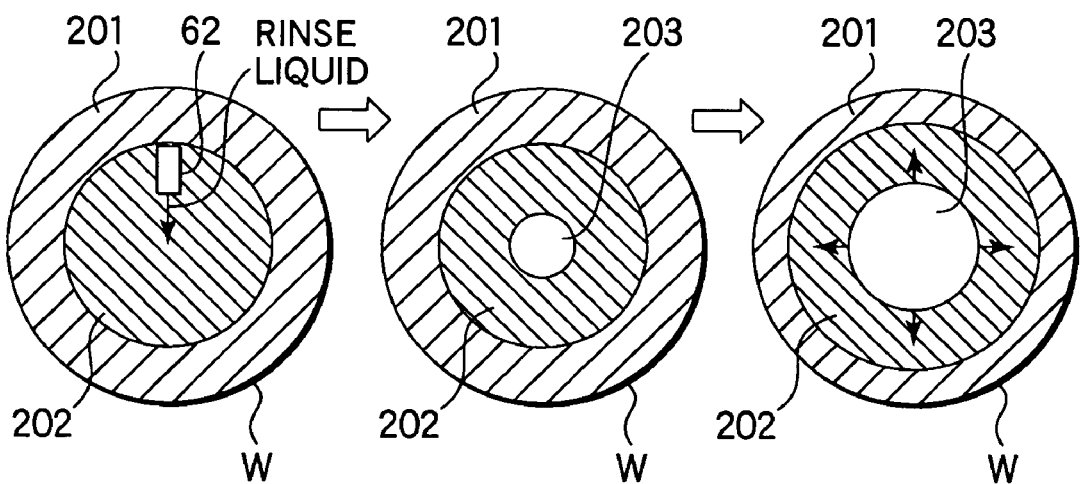
FIGS. 17A to 17C are diagrams for explaining an optimal rinse condition when the contact angle at the wafer surface is equal to or greater than 30 degrees.

The group 5 in FIG. 12 represents a case where the contact angle to the rinse liquid (pure water) after development is equal to or greater than 30 degrees. According to the optimal recipe e corresponding to this case, as shown in FIGS. 17A and 17B, for example, first, the film 202 of the rinse liquid is formed at the center portion of the wafer W (e.g., a radius of 50 mm or so from the center) (FIG. 17A) as done in FIG. 16A. Subsequently, unlike in the process in FIG. 16B, the core of the dry region 203 is formed at the center of the wafer W while rotating the wafer W, without supplying an inactive gas like an $N*2$ gas (FIG. 17B). Drying progresses as the dry region 203 is widened by rotating the wafer W and pushing out the developer paddle 201 with the rinse liquid (FIG. 17C). Because drying progresses by pushing out the developer with the rinse liquid, as done in the case of the recipe c, the rinse liquid is prevented from being cut during the dry process, which would otherwise leave development defects at the cut portion, even if the contact angle on the surface of the wafer W is high.

Figure 18:
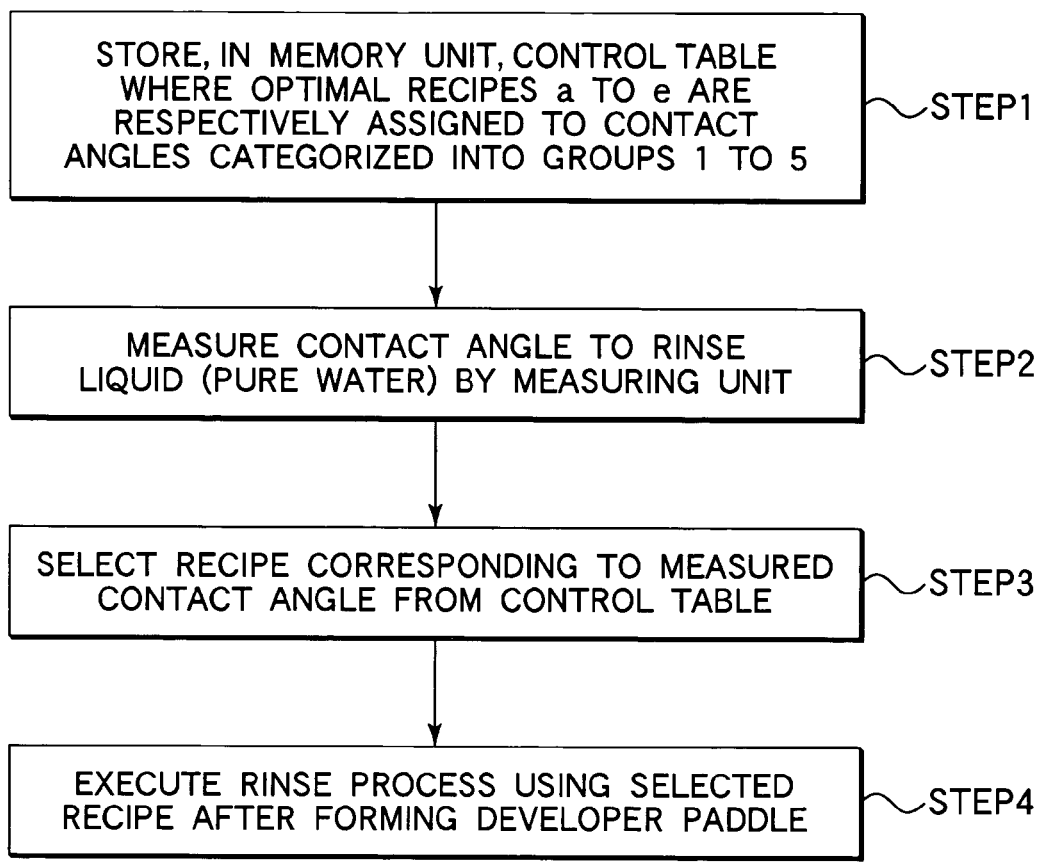
FIG. 18 is a flowchart for explaining one example of the rinse method of the invention.

A description will be given below of a rinse method according to one embodiment of the invention which is executed using the developing apparatus 80 with reference to a flowchart in FIG. 18.

First, the control table 120 where the contact angles to the rinse liquid (pure water) shown in FIG. 12 are categorized into the groups 1 to 5 to which the optimal recipes a to e are assigned respectively is stored in the memory unit 86 beforehand, and the recipes a to e are made executable in response to an instruction from the controller 90 (step 1).

Next, after the resist coating process, the exposure process and the development process are performed on the first wafer in the manner described above, the wafer is transferred to the measuring unit 85 to measure the contact angle to the rinse liquid (pure water) after development (step 2). At this time, the rinse condition after development is the initial setting.

Next, the measured contact angle of the wafer W is output from the measuring unit 85 to the controller 90 which in turn selects a recipe for the rinse process corresponding to the contact angle from the control table 120 stored in the memory unit 86 (step 3).

Then, after the resist coating process and the exposure process for a next wafer W are completed, the wafer W is transferred into the developing unit (DEV), the developer supply nozzle 61 is moved above the wafer W to expel the developer in the form of a band from the developer supply nozzle 61, and the wafer W is rotated by at least a half turn, e.g., one turn, to form a developer paddle after which the rinse process is performed using the selected recipe (step 4).

Because the optimal recipe with fewer development defects is set in the control table 120 according to each contact angle group, as long as a recipe corresponding to the measured contact angle is selected, a post-development rinse process with extremely few development defects can be carried out using the recipe.

Provided that the optimal recipes which hardly cause development defects are set in association with individual contact angle groups, simple measuring of the contact angle of a wafer can lead to prompt select of the optimal recipe corresponding to the measured contact angle, and a rinse process for the wafer W can be performed under the condition given in the recipe. It is therefore possible to promptly grasp the optimal condition regardless of a target wafer and perform a rinse process with fewer development defects.

The invention is not limited to the above-described embodiment, but may be modified in various other forms. Although the control table 120 is set in the memory unit 86 in the embodiment, for example, the use of such a control table is not essential. Although a recipe is automatically selected based on the result of measurement done by the measuring unit 85 and a rinse process is executed using the recipe in the embodiment, the operator may select an optimal recipe preset based on the measurement result through a button operation or an operation on the monitor screen, and a rinse process may be executed using the recipe. Further, the position of the measuring unit is not limited to the one in the embodiment, but may be located in the developing unit or in another unit in the resist coating and developing system. The measuring unit may also be located outside the resist coating and developing system. Furthermore, while the index indicating the surface state has been illustrated as the use of a dynamic contact angle, the index may be a static contact angle or may be another index different from the contact angle. Moreover, although pure water is used as an example of the rinse liquid, pure water in which another substance, such as a surface active agent, is added may be used as well. The application of the invention is not limited to a developing process after the ordinary resist exposure process, and the invention can be adapted to a developing process after an immersion exposure process. The invention which is adapted to a rinse process for semiconductor wafers in the embodiment is not limited to this application, but can be adapted to a rinse process for other substrates, such as a substrate for a liquid crystal display (LCD), as long as a micro resist pattern is formed on the substrate. Further, adequate combinations of the components of the embodiment and a design having some of the components of the embodiment removed are well within the scope or spirit of the invention without departing from the spirit or scope of the invention.

What is claimed is:

1. A rinsing method for rinsing a substrate having an exposure pattern thereon after developing the exposure pattern, the rinsing method comprising the following steps:
    (A) measuring a contact angle formed by a rinse liquid on each of different surface states that respectively appear on substrates processed by development;
    (B) sorting the surface states into different groups based on different ranges of values of the contact angles measured in step (A);
    (C) allocating rinsing processes, which cause development defects to fall within a tolerance, to the groups defined in step (B), thereby generating reference data comprising correlations between said different value ranges and the rinsing processes;
    (D) storing the reference data generated in step (C) in a memory unit in the form of a control table;
    (E) measuring a contact angle formed by a rinse liquid on a surface of a target substrate processed by development, thereby obtaining a measurement angle value;
    (F) checking the measurement angle value obtained in step (E) against the reference data in the control table to determine to which contact angle value range the contact angle measured in step (E) corresponds;
    (G) selecting from the groups, a specific group which the measurement angle value belongs to and regarding one of the rinsing processes allocated to the specific group as an adequate rinsing process;
    (H) rinsing the target substrate by use of the adequate rinsing process; and
    (I) repeating steps (E) through (H) for another subsequent target substrate.

2. The rinsing method according to claim 1, wherein
    the reference data obtained in step (C) is stored in a memory unit in a storage section of an apparatus for rinsing the target substrate, and
    steps (E) through (H) are automatically performed by a control section in accordance with the measurement angle value.

3. The rinsing method according to claim 1, wherein the rinsing processes include a first rinsing process allocated to a group according to a first contact angle value range, and the first rinsing process comprises the steps of:
    supplying the rinse liquid onto a center of the target substrate while rotating the target substrate, thereby forming a film of the rinse liquid over the target substrate;
    then, supplying an inactive gas onto the center of the target substrate while rotating the target substrate to form a core of a dry region at the center of the target substrate; and
    then, rotating the target substrate to expand the dry region outward, thereby drying the target substrate.

4. The rinsing method according to claim 3, wherein the rinsing processes include a second rinsing process allocated to a group according to a second contact angle value range that is larger than the first contact angle value range, and the second rinsing process comprises the steps of:
    supplying the rinse liquid onto a center of the target substrate while rotating the target substrate, thereby forming a film of the rinse liquid over the target substrate;
    then, supplying an inactive gas onto the center of the target substrate while rotating the target substrate to form a core of a dry region at the center of the target substrate; and
    then, rotating the target substrate to expand the dry region outward, thereby drying the target substrate, while performing a scan rinse of moving a supply point of the rinse liquid outward from a central side of the target substrate while supplying the rinse liquid.

5. The rinsing method according to claim 3, wherein the rinsing processes include a second rinsing process allocated to a group according to a second contact angle value range that is larger than the first contact angle value range, and the second rinsing process comprises the steps of:
    supplying the rinse liquid onto a center of the target substrate while keeping the target substrate stopped or while rotating the target substrate at a low speed, and stopping supply of the rinse liquid before a boundary formed between the rinse liquid and a developer liquid reaches an outer edge of the target substrate, thereby forming a film of the rinse liquid on a central portion of the target substrate;
    then, supplying an inactive gas onto the center of the target substrate while rotating the target substrate to form a core of a dry region at the center of the target substrate; and
    then, rotating the target substrate to expand the dry region outward while pushing the developer liquid by the rinse liquid, thereby drying the target substrate.

6. The rinsing method according to claim 3, wherein the rinsing processes include a second rinsing process allocated to a group according to a second contact angle value range that is larger than the first contact angle value range, and the second rinsing process comprises the steps of:
    supplying the rinse liquid onto a center of the target substrate while keeping the target substrate stopped or while rotating the target substrate at a low speed, and stopping supply of the rinse liquid before a boundary formed at this time between the rinse liquid and a developer liquid reaches an outer edge of the target substrate, thereby forming a film of the rinse liquid on a central portion of the target substrate;
    then, rotating the target substrate without supplying an inactive gas, thereby forming a core of a dry region at the center of the target substrate; and
    then, rotating the target substrate to expand the dry region outward while pushing out the developer liquid by the rinse liquid, thereby drying the target substrate.

7. A developing apparatus for developing an exposure pattern, the developing apparatus comprising:
   a holding member configured to hold and rotate a target substrate;
   a developer liquid nozzle configured to supply a developer liquid onto the target substrate held by the holding member;
   a rinse liquid nozzle configured to supply a rinse liquid onto the target substrate held by the holding member;
   a control section configured to control an operation of the developing apparatus; and
   a storage section for storing a reference data for rinsing processes, the reference data having been prepared by:
   (A) measuring a contact angle formed by a rinse liquid on each of different surface states that respectively appear on substrates processed by development;
   (B) sorting the surface states into different groups based on different ranges of values of the contact angles measured in step (A);
   (C) allocating rinsing processes, which cause development defects to fall within a tolerance, to the groups defined in step (B), thereby generating reference data comprising correlations between said different value ranges and the rinsing processes; and
   (D) storing the reference data generated in step (C) in a memory unit in the form of a control table.

8. The developing apparatus according to claim 7, wherein the control section is preset to execute:
   receiving a measurement angle value obtained by measuring a contact angle formed by the rinse liquid on a surface of a target substrate processed by development;
   checking the measurement angle value against the reference data stored in the storage section, thereby determining a rinsing process to be performed on the target substrate, while selecting from the groups a specific group which the measurement angle value belongs to and regarding one of the rinsing processes allocated to the specific group as an adequate rinsing process; and
   controlling the developing apparatus to rinse the target substrate by use of the adequate rinsing process.

9. The developing apparatus according to claim 7, wherein the developing apparatus further comprises a surface state measuring unit configured to measure the contact angle.

10. The developing apparatus according to claim 9, wherein the surface state measuring unit is connected to the control section.

* * * * *